United States Patent
Chang et al.

(10) Patent No.: US 9,449,889 B2
(45) Date of Patent: *Sep. 20, 2016

(54) METHOD FOR MONITORING ION IMPLANTATION

(71) Applicant: Taiwan Semiconductor Manufacturing Company, Ltd., Hsin-Chu (TW)

(72) Inventors: Chun-Lin Chang, Jhubei (TW);
Chih-Hong Hwang, New Taipei (TW);
Nai-Han Cheng, Hsin-Chu (TW);
Chi-Ming Yang, Hsin-Chu (TW);
Chin-Hsiang Lin, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/684,953

(22) Filed: Apr. 13, 2015

(65) Prior Publication Data

US 2015/0221561 A1 Aug. 6, 2015

Related U.S. Application Data

(62) Division of application No. 13/918,731, filed on Jun. 14, 2013, now Pat. No. 9,006,676, which is a division of application No. 13/235,088, filed on Sep. 16, 2011, now Pat. No. 8,581,204.

(51) Int. Cl.
*H01L 21/66* (2006.01)
*H01J 37/244* (2006.01)
*H01J 37/317* (2006.01)
*H01L 21/265* (2006.01)

(52) U.S. Cl.
CPC ............ *H01L 22/10* (2013.01); *H01J 37/244* (2013.01); *H01J 37/3171* (2013.01); *H01L 21/265* (2013.01); *H01J 2237/24542* (2013.01); *H01J 2237/30455* (2013.01); *H01J 2237/31703* (2013.01)

(58) Field of Classification Search
CPC .. H01J 37/3171; H01J 37/244; H01J 37/304; H01J 2237/24542
See application file for complete search history.

(56) References Cited

U.S. PATENT DOCUMENTS

| | | | |
|---|---|---|---|
| 4,751,393 A | 6/1988 | Corey et al. |
| 4,755,049 A | 7/1988 | Bomback et al. |
| 4,980,562 A | 12/1990 | Berrian et al. |
| 6,020,592 A | 2/2000 | Liebert et al. |
| 6,507,033 B1 | 1/2003 | Musket et al. |
| 6,566,661 B1 | 5/2003 | Mitchell |

(Continued)

FOREIGN PATENT DOCUMENTS

| | | |
|---|---|---|
| CN | 101467227 A | 6/2009 |
| KR | 20030042491 A | 6/2003 |
| KR | 20070020023 A | 2/2007 |

*Primary Examiner* — Marcus Taningco
(74) *Attorney, Agent, or Firm* — Slater Matsil, LLP

(57) ABSTRACT

A method comprises placing a wafer and a ring-shaped beam profiler on a wafer holder, wherein the ring-shaped beam profiler is adjacent to the wafer, moving a first sensor and a second sensor simultaneously with the wafer holder, receiving a first sensed signal and a second sensed signal from the first sensor and the second sensor respectively and adjusting an ion beam generated by an ion beam generator based upon the first sensed signal and the second sensed signal.

20 Claims, 4 Drawing Sheets

(56) References Cited

U.S. PATENT DOCUMENTS

| | | |
|---|---|---|
| 6,580,083 B2 | 6/2003 | Berrian |
| 6,903,348 B2 | 6/2005 | Jang et al. |
| 7,132,672 B2 | 11/2006 | Walther et al. |
| 7,309,997 B1 | 12/2007 | Radovanov et al. |
| 9,006,676 B2 * | 4/2015 | Chang et al. .......... 250/394 |
| 2003/0094583 A1 | 5/2003 | Jang et al. |
| 2004/0262533 A1 | 12/2004 | Krueger |
| 2005/0191409 A1 | 9/2005 | Murrell et al. |
| 2008/0087844 A1 | 4/2008 | Nunan et al. |
| 2009/0179161 A1 | 7/2009 | Ward et al. |
| 2012/0190135 A1 | 7/2012 | Ito et al. |

\* cited by examiner

METHOD FOR MONITORING ION IMPLANTATION

This application is a divisional of U.S. patent application Ser. No. 13/918,731, entitled "Apparatus for Monitoring Ion Implantation," filed on Jun. 14, 2013 which is a divisional of U.S. patent application Ser. No. 13/235,088, entitled "Apparatus for Monitoring Ion Implantation," filed on Sep. 16, 2011, now U.S. Pat. No. 8,581,204 issued Nov. 12, 2013, which applications are incorporated herein by reference.

BACKGROUND

Since the invention of the integrated circuit, the semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrink the process node towards the sub-20 nm node). As the demand for miniaturization continues, the further shrinking of the process node may increase the complexity of fabricating integrated circuits.

As semiconductor technologies evolve, semiconductor fabrication processes have become more sophisticated and hence require complex equipment and fixtures. In the semiconductor process, integrated circuits are fabricated on a semiconductor wafer. The semiconductor wafer goes through many processing steps before a plurality of integrated circuits are separated by cutting the semiconductor wafer. The processing steps may include lithography, etching, doping and depositing different materials.

Ion implantation is a processing technique for doping different atoms or molecules into a wafer. By employing ion implantation, the majority charge carrier may be altered so as to produce regions in the wafer having different types and levels of conductivity. In an ion implanter, an ion generator may generate an ion beam and direct the ion beam towards the target wafer. In accordance with the cross section of ion beams, ion implantation processes may be divided into two categories, namely a ribbon beam with a rectangular cross section and a spot beam with a circular cross section.

Furthermore, in order to achieve a uniform ion distribution on the target wafer, either the wafer to be implanted or the ion beam is scanned. In accordance with the scanning pattern, ion implantation processes may be divided into two categories, namely a one-dimensional (1-D) ion implantation scan or a two-dimensional (2-D) ion implantation scan. In addition, a variety of ion implantation monitoring systems may be employed to characterize ion beams before an ion implantation process occurs. However, an unexpected fluctuation in the ion beams may cause a non-uniform ion distribution in the target wafer.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, an apparatus for monitoring the uniformity of an ion implantation process. The invention may also be applied, however, to a variety of ion implantation processes and devices, such as high energy ion implanters, high current ion implanters, medium current implanters and the like.

Figure 1:
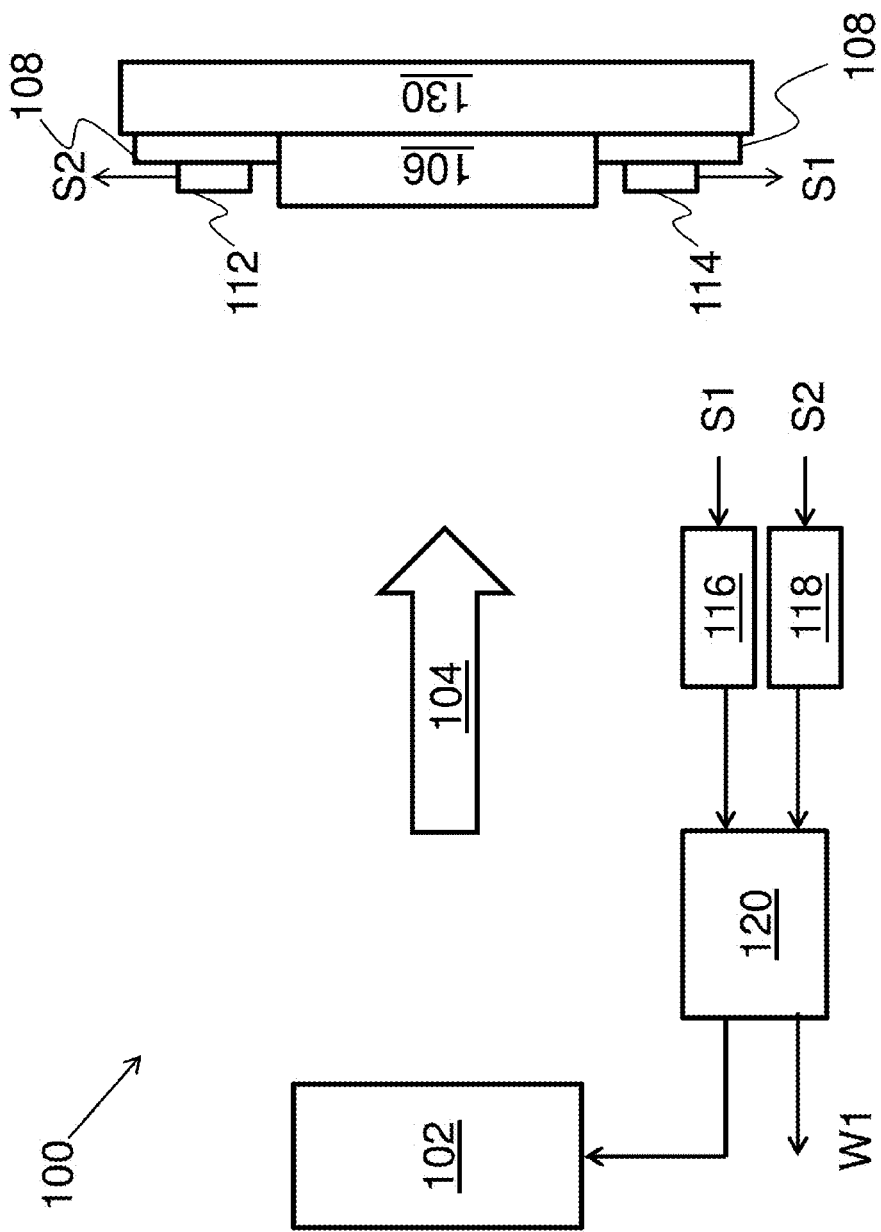
FIG. 1 illustrates a schematic diagram of an ion implantation system in accordance with an embodiment.

Referring initially to FIG. 1, a schematic diagram of an ion implantation system is illustrated in accordance with an embodiment. The ion implantation system 100 comprises an ion beam generator 102, an ion beam 104, a wafer 106 and an apparatus for monitoring an ion implantation process. The ion implantation monitoring apparatus further comprises a ring-shaped beam profiler 108, a plurality of sensors 112 and 114, a plurality of current meters 116 and 118 and a controller 120. As shown in FIG. 1, the ion beam generator 102 generates the ion beam 104 and directs the ion beam 104 towards the wafer 106 as well as the sensors 112 and 114. The controller 120 receives detected ion distribution information and compensates the current of ion beam 104 by either adjusting a scanning frequency of the ion beam 104 or adjusting the movement speed of the wafer 106 relative to the ion beam 104.

The wafer 106 may be made of silicon or other semiconductor materials such as silicon germanium. The wafer 106 may go through many processing steps such as lithography, etching, doping before a completed die is formed. During a doping process, the wafer 106 may be placed on a wafer holder 130 for an ion implantation process. The quality of the completed die may depend largely on the uniformity of ions embedded in the wafer 106. For example, an uneven distribution of ions in the wafer 106 may cause a poor drive current uniformity (IDU) or threshold voltage uniformity (VTU) in transistors of the wafer 106.

In order to achieve a uniform ion distribution during an ion implantation process, the ring-shaped beam profiler 108 is employed to accommodate a plurality of sensors 112 and 114. In accordance with an embodiment, the ring-shaped beam profiler 108 is formed of graphite. As shown in FIG. 1, the ring-shaped beam profiler 108 and the sensors 112 and 114 are placed adjacent to the wafer 106. As a result, the sensors 112 and 114 may receive the same ions as the wafer 106 during an ion implantation process. It should be noted that while FIG. 1 shows both the sensors 112 and 114 are mounted on the ring-shaped beam profiler 108, the sensors 112 and 114 can be embedded in the ring-shaped beam profiler 108.

FIG. 1 further illustrates the ion beam generator 102. The ion beam generator 102 may comprise a variety of components (e.g., ion separation and ion acceleration devices) to generate the ion beam 104 and direct the ion beam 104 toward the wafer 106. The detailed configuration of the ion beam generator 102 is not illustrated herein so as to avoid unnecessary dilution of the innovative aspects of the various embodiments. The ion beam 104 may be a spot beam, which has a circular cross section. Alternatively, the ion beam 104 may be a ribbon beam, which has a rectangular cross section. An ion beam (e.g., ion beam 104) may be of a smaller cross section than the diameter of the wafer 106. In order to achieve a uniform ion distribution on the wafer 106, either scanning an ion beam or moving a wafer relative to an ion beam is employed to increase the wafer area to be implanted evenly.

In accordance with an embodiment, the ion beam 104 may have a Gaussian-type non-uniform beam current distribution. More particularly, the ion beam 104 may have a bell shape in the middle and two long tails on both sides. A scan path is formed by scanning the ion beam 104 along±Y directions shown in FIG. 1. Along the scan path, the bell shape portion and the long tail portion of the ion beam 104 are averaged to form a uniform beam current distribution. The uniform beam current distribution may be commonly referred to as an ion beam current profile.

In accordance with an embodiment, a plurality of sensors 112 and 114 are located within the uniform ion beam current distribution. As such, the sensors 112 and 114 may receive the same number of ion particles as the wafer regions similar in size. Furthermore, while FIG. 1 shows two sensors 112 and 114, additional sensors may be placed on the ring-shaped beam profiler 108 so that the ion particle density of each sub-regions of the wafer 106 can be better estimated. The sensed signals from the sensors are sent to a plurality of current meters (e.g., current meter 116) coupled to the sensors respectively.

In accordance with an embodiment, a Faraday detector such as a Faraday cup may be implemented to achieve the function of sensing ion particles from the ion beam 104 and converting the number of sensed ion particles into a current value. In other words, the sensor (e.g., sensor 114) and the current meter (e.g., current meter 116) may be replaced by a Faraday cup. The operation details of Faraday cup are well known in the art, and hence are not discussed in further detail.

The current signals from the current meter 116 and the current meter 118 are sent to a controller 120. The controller 120 may be a microprocessor, a computer and/or the like. Based upon the current signals, the controller 120 calculates the ion distribution of each region of the wafer 106. Furthermore, by employing a feedback algorithm, the controller 120 may adjust either the scanning frequency of the ion beam 104, the movement speed of the wafer 106 or a combination thereof. For example, when the controller 120 determines that the number of ion particles received by a region of the wafer 106 is low, the controller 120 may send signals to slow down the scanning frequency of the ion beam 104 when the region is passing through the ion beam 104. Alternatively, the controller 120 may send signals to slow down the movement speed of the wafer 106 from the time the region starts to receive ion particles to the time the region moves away from the ion beam 104. An advantageous feature of having a plurality of sensors placed adjacent to the wafer 106 is that the ion density of each region of the wafer 106 can be better estimated so that a uniform ion implantation process can be achieved by employing a feedback mechanism to adjust either the scanning frequency of the ion beam 104 or the movement speed of the wafer 106.

Figure 2:
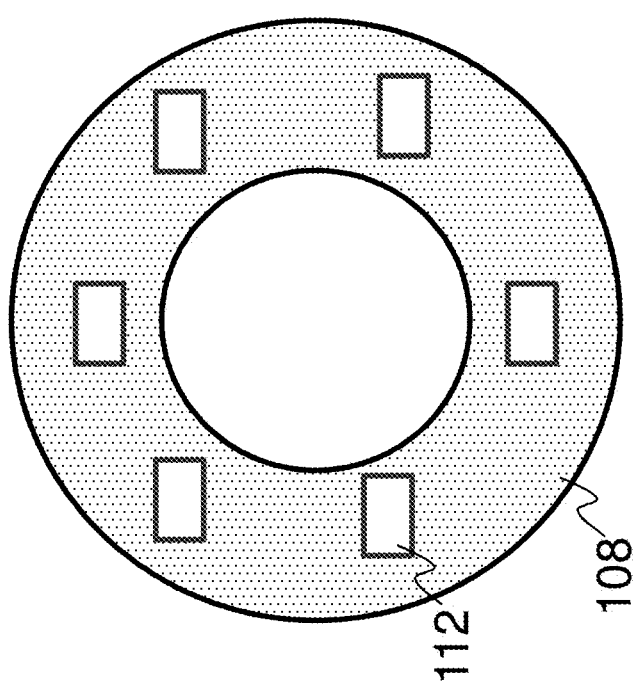
FIG. 2 illustrates a top view of a ring-shaped beam profiler in accordance with an embodiment.

FIG. 2 illustrates a top view of a ring-shaped beam profiler in accordance with an embodiment. The ring-shaped beam profiler 108 may be a donut-shaped object. The inner diameter of the ring-shaped beam profiler 108 may be 300 mm or 450 mm in response to wafer size variations. The outer diameter of the ring-shaped beam profiler 108 may be 20 mm more than the inner diameter (not to scale for better illustrating the ring-shaped beam profiler 108). On the ring-shaped beam profiler 108, there may be a plurality of sensors (e.g., sensor 112). Each sensor is coupled to a current meter (not shown). In accordance with an embodiment, the sensors (e.g., sensor 112) are formed of graphite. In order to have the sensors detecting ions, there may be a plurality of graphite regions on the ring-shaped beam profiler 108. The graphite regions may be formed on top of the ring-shaped beam profiler 108. Alternatively, the graphite regions may be embedded in the ring-shaped beam profiler 108. It should be noted that in FIG. 2 the graphite regions are substantially rectangular in shape. It is within the scope and spirit of the invention for the graphite regions to comprise other shapes, such as, but no limited to oval, square, circular and the like.

Figure 3:
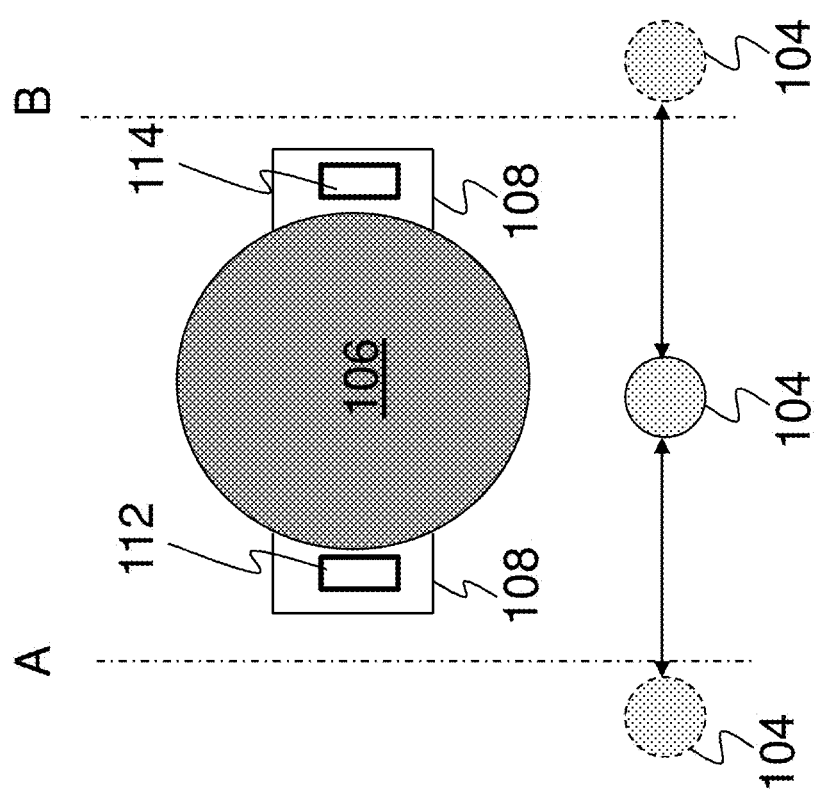
FIG. 3 illustrates an effective range for placing ion plantation sensors in accordance with an embodiment.

FIG. 3 illustrates an effective range for placing ion plantation sensors in accordance with an embodiment. An embodiment ion implantation monitoring apparatus including a ring-shaped beam profiler is shown above with respect to FIG. 2. However, the implementation of the ion implantation monitoring apparatus is not limited to a donut-shaped ring. Instead, a variety of alternatives can be used to accurately estimate the ion implantation distribution on the wafer 106. For example, when the ion beam 104 scans along±X directions shown in FIG. 3, an effective beam current range or region is generated as indicated by a dashed line A and a dashed line B. Within the effective range or region, by scanning the ion beam 104, the ion beam generator (not shown) generates a beam current profile, which is uniform between the dashed line A and the dashed line B. As such, the sensors as well as the ring-shaped beam profiler 108 can be any shape as long as they are located within the effective range of the ion beam 104. In addition, the sensors and the ring-shaped beam profiler may be attached to the wafer or the wafer support apparatus (e.g., a wafer holder). As a result, the sensors can share the same movement as the wafer 106.

Figure 4:
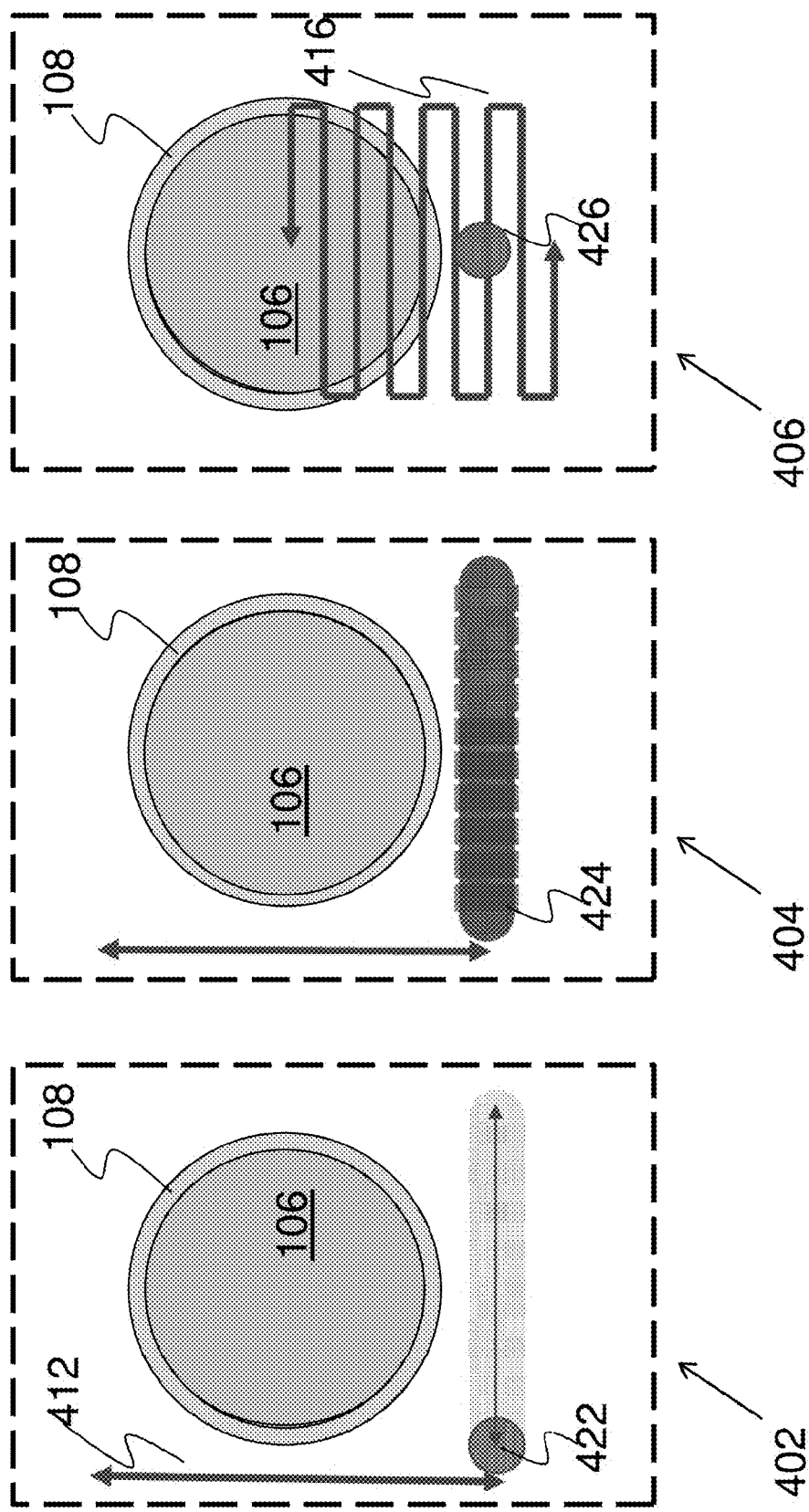
FIG. 4 illustrates an embodiment method for monitoring ion implantation involving a one dimensional (1-D) mechanical scan and a two dimensional (2-D) mechanical scan in accordance with an embodiment.

FIG. 4 illustrates an embodiment method for monitoring ion implantation involving a one dimensional (1-D) mechanical scan and a two dimensional (2-D) mechanical scan in accordance with an embodiment. A first 1-D mechanical scan 402 shows that a spot beam 422 moves back and forth between two endpoints. As a result, a uniform ion plantation current profile is generated along the scanning path between the two endpoints. At the same time, the wafer 106 as well as the ring-shaped beam profiler 108 may move across the scanning path as indicated by the double-headed arrow. The relative movement of the wafer 106 helps to produce a uniform ion dose on each region of the wafer 106.

Furthermore, because the ring-shaped beam profiler 108 moves simultaneously with the wafer 106 and the ring-shaped beam profiler 108 is located within the effective range of the uniform ion implantation current file, the detected ion dose on the sensors (not shown) of the ring-shaped beam profiler may reflect the ion dose of the wafer 106. By employing additional sensors, the additional sensors may help to provide a better resolution of the ion dose of each region of the wafer 106. Furthermore, additional sensors may help to determine the angle of incidence of the ion beam 104.

FIG. 4 further illustrates a ring-shaped beam profiler 108 applicable to a ribbon beam 424 of a 1-D mechanical scan. Implementing an ion implantation process using a ribbon beam is well known in the art, and hence is not discussed in detail to avoid unnecessary repetition. Similar to the ring-shaped beam profiler 108 described above with respect 402, a second 1-D mechanical scan 404 shows the ring-shaped beam profiler 108 is located within the effective range of a uniform beam current profile. In addition, the ring-shaped beam profiler 108 moves simultaneously with the wafer 106. As such, by employing a plurality of sensors on the ring-shaped beam profiler 108, the sensors can detect the ion dose of the wafer 106.

FIG. 4 further illustrates a ring-shaped beam profiler 108 applicable to a spot beam 426 of a 2-D mechanical scan. Implementing an ion implantation process using a 2-D mechanical scan is well known in the art, and hence is not discussed in detail to avoid unnecessary repetition. The double-headed arrow 416 indicates the movement path of the wafer 106 as well as the ring-shaped beam profiler 108. In other words, the wafer as well as the ring-shaped beam profiler 108 may pass the stationary ion beam multiple times along the horizontal direction. At the same time, the wafer 106 as well as the ring-shaped beam profiler 108 may move vertically in a small step. The 2-D movement of the wafer 106 may result in uniform exposure of the ion beam. As such, by employing a plurality of sensors on the ring-shaped beam profiler 108, the sensors can detect the ion dose of the wafer 106.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
placing a wafer on a wafer holder;
placing a ring-shaped beam profiler on the wafer holder, wherein the ring-shaped beam profiler is adjacent to the wafer;
moving a first sensor with the wafer holder;
coupling a first current meter to the first sensor; and
receiving a first sensed signal from the first sensor.

2. The method of claim 1, wherein:
the first sensor and the wafer holder are located within an effective region of a uniform ion implantation current profile.

3. The method of claim 2, further comprising:
forming the uniform ion implantation current profile through a 1-D mechanical scan using a spot ion beam.

4. The method of claim 2, further comprising:
forming the uniform ion implantation current profile through a 1-D mechanical scan using a ribbon ion beam.

5. The method of claim 2, further comprising:
forming the uniform ion implantation current profile through a 2-D mechanical scan using a spot ion beam.

6. The method of claim 2, further comprising:
moving a second sensor simultaneously with the wafer holder, wherein the second sensor is located within the effective region of the uniform ion implantation current profile;
coupling a second current meter to the second sensor; and
receiving a second sensed signal from the second sensor.

7. The method of claim 6, wherein:
the first sensor is placed on the ring-shaped beam profiler; and
the second sensor is placed on the ring-shaped beam profiler.

8. The method of claim 1, further comprising:
placing a first Faraday cup adjacent to the wafer on the wafer holder; and
placing a second Faraday cup, wherein the second Faraday cup and first Faraday cup are symmetrical relative to the wafer.

9. A method comprising:
placing a wafer on a wafer holder;
placing a ring-shaped beam profiler on the wafer holder, wherein the ring-shaped beam profiler is adjacent to the wafer;
moving a first sensor and a second sensor with the wafer holder;
coupling a first current meter and a second current meter to the first sensor and the second sensor respectively; and
receiving a first sensed signal and a second sensed signal from the first sensor and the second sensor respectively.

10. The method of claim 9, wherein:
the first sensor and the second sensor are located within an effective region of a uniform ion implantation current profile.

11. The method of claim 9, further comprising:
coupling a controller to the first current meter and the second current meter; and
adjusting an ion beam generated by an ion beam generator based upon the first sensed signal and the second sensed signal.

12. The method of claim 11, further comprising:
adjusting a scanning frequency of the ion beam based upon the first sensed signal and the second sensed signal.

13. The method of claim 11, further comprising:
adjusting a movement speed of the wafer holder based upon the first sensed signal and the second sensed signal.

14. The method of claim 11, further comprising:
generating a spot ion beam using a 1-D mechanical scan.

15. The method of claim 11, further comprising:
generating a ribbon ion beam using a 1-D mechanical scan.

16. A method comprising:
placing a wafer and a ring-shaped beam profiler on a wafer holder, wherein the ring-shaped beam profiler is adjacent to the wafer;

moving a first sensor and a second sensor simultaneously with the wafer holder;

receiving a first sensed signal and a second sensed signal from the first sensor and the second sensor respectively; and adjusting an ion beam generated by an ion beam generator based upon the first sensed signal and the second sensed signal.

17. The method of claim 16, wherein:
the first sensor and the second sensor are placed on the ring-shaped beam profiler.

18. The method of claim 16, wherein:
the first sensor and the second sensor are in direct contact with a top surface of the ring-shaped beam profiler, and wherein a bottom surface of the ring-shaped beam profiler is in direct contact with a top surface of the wafer holder.

19. The method of claim 16, further comprising:
generating a uniform ion implantation current profile from the ion beam.

20. The method of claim 19, wherein:
the first sensor and the second sensor are located within an effective region of the uniform ion implantation current profile.

* * * * *